United States Patent
Grollitsch et al.

(10) Patent No.: US 9,258,110 B2
(45) Date of Patent: Feb. 9, 2016

(54) PHASE DETECTOR

(71) Applicant: Infineon Technologies AG, Neubiberg (DE)

(72) Inventors: Werner Grollitsch, Villach (AT); Roberto Nonis, Warmbad-Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/266,785

(22) Filed: Apr. 30, 2014

(65) Prior Publication Data

US 2015/0318980 A1    Nov. 5, 2015

(51) Int. Cl.
*H03D 3/24* (2006.01)
*H04L 7/033* (2006.01)
*H04L 7/00* (2006.01)

(52) U.S. Cl.
CPC ............ *H04L 7/0331* (2013.01); *H04L 7/0054* (2013.01)

(58) Field of Classification Search
CPC ........ H04L 7/033; H04L 37/36; H03L 7/0891

USPC .......... 375/376, 327, 373, 375; 327/106, 156, 327/158, 159; 455/103, 127, 307, 325
See application file for complete search history.

(56) References Cited

U.S. PATENT DOCUMENTS

| | | | |
|---|---|---|---|
| 6,326,851 B1 | 12/2001 | Staszewski et al. | |
| 2011/0182382 A1* | 7/2011 | Staszewski et al. | 375/298 |
| 2011/0267122 A1 | 11/2011 | Jeong et al. | |
| 2012/0025879 A1* | 2/2012 | Matsuda | 327/156 |
| 2012/0139587 A1* | 6/2012 | Drago et al. | 327/106 |

OTHER PUBLICATIONS

Grollitsch, W., "A 1.4psrms-period-jitter TDC-less franctional-N digital PLL with digitally controlled ring oscillator in 65nm CMOS," Solid-State Circuit Conference Digest of Technical Papers, Feb. 7-11, 2010, pp. 478-480.

Palermo, S., "ECEN720: High Speed Links Circuits and Systems," Analog & Mixed-Signal Center, Texas A&M University, Spring 2014.

* cited by examiner

*Primary Examiner* — Khai Tran
(74) *Attorney, Agent, or Firm* — Slater & Matsil, L.L.P.

(57) ABSTRACT

A phase detector device having a modulo N operator coupled with an adder is disclosed. Furthermore, clock recovery devices using such a phase detector device are discussed.

20 Claims, 4 Drawing Sheets

US 9,258,110 B2

PHASE DETECTOR

TECHNICAL FIELD

The present application relates to phase detectors, phase locked loops, clock and data recovery circuits and to corresponding methods.

BACKGROUND

For data transmission, for example, for data transmission via serial data interfaces, in many applications data is transferred without transmitting a clock signal. For example, data may be transmitted via a single line or a differential line, in order to reduce the number of necessary signal lines and to reduce power. In such applications, a data clock on a transmitter side is in many cases generated by using a digital or analog phase locked loop (PLL), which allows a generation of a desired clock signal based on a reference clock. On a receiver side, different approaches may be used. For example, in some cases a receive clock signal may also be generated using a phase locked loop which may, for example, be clocked by a local quartz oscillator (XTAL) or other device, which may sample incoming data after a phase alignment has been found. In a different approach, for example, in cases where no reference clock signal like a quartz oscillator is available at a receiver, a so-called clock and data recovery circuit is used, which extracts and generates a receive clock signal based on the incoming data stream.

DETAILED DESCRIPTION OF ILLUSTRATIVE EMBODIMENTS

Figure 1:
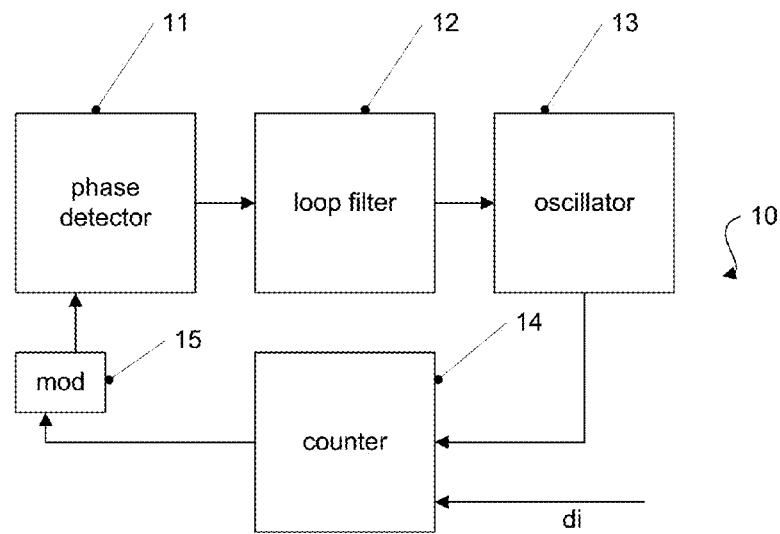
FIG. 1 is a schematic block diagram illustrating a clock recovery circuit according to an embodiment.

In the following, various embodiments will be described in detail with reference to the attached drawings. It should be noted that these embodiments serve as examples only and are not to be construed as limiting. For example, while embodiments may be described as comprising a plurality of features or elements, in other embodiments some of these features or elements may be omitted, and/or may be replaced by alternative features or elements. In other embodiments, additionally or alternatively additional features or elements apart from the ones explicitly described may be provided.

Furthermore, features or elements from different embodiments may be combined to form further features or elements.

Connections or couplings shown in the drawings or described herein may be direct connections or couplings, i.e., connections or couplings without intervening elements, or indirect connections or couplings, i.e., connections or couplings with one or more intervening elements, as long as the general function of the connection or coupling, for example, to transmit a certain kind of information or signal, is essentially maintained. Furthermore, connections or couplings may be implemented as wireless connections or couplings or as wire-based connections or couplings unless noted otherwise.

In embodiments, all digital clock recovery circuits to recover a clock from incoming data may be provided. In some embodiments, a counter may receive an incoming data signal, and count a number of oscillations output by an oscillator controlled by the incoming data signal, for example, being reset at each falling edge, rising edge or both of the incoming data signal. An output of the counter may be provided to a modulo operation prior to being fed to a phase detector, which may be implemented as an adder.

In some embodiments, a phase detector is provided comprising a modulo operation at an input thereof.

In other embodiments, a circuit may be switchable between a clock recovery mode and a phase locked loop (PLL) mode.

In other embodiments, other techniques may be employed.

Turning now to the figures, in FIG. 1 a clock recovery circuit 10 usable for clock and data recovery (CDR) is schematically shown. Some or all of the components of clock recovery circuit 10 may be provided on a single chip, and/or may be implemented as an all digital device. Components of clock recovery circuit 10 may be implemented in hardware, software, firmware or combinations thereof.

In the embodiment of FIG. 1, a controllable oscillator 13 generates one or more output signals having a controllable frequency. In embodiments, oscillator 13 may be a digitally controlled oscillator (DCO), for example, a digitally controlled ring oscillator. Other oscillator implementations may also be used.

In case oscillator 13 provides more than one output signal, the output signals of oscillator 13 may have a same frequency but different phases. For example, three output signals with 120 degrees phase offset between them or four output signals with 90 degrees phase offset between them may be provided.

Counter 14 receives one or more signals from oscillator 13 and additionally receives a data signal di. Counter 14 then counts cycles (periods) of a signal received from oscillator 13 between edges, for example, between rising edges, falling edges or both, of data input signal di. In some embodiments, counter 14 may additionally sample different phases of the output signals of oscillator 13, in case more than one output signal is provided.

In embodiments, a clock frequency of oscillator 13 is higher than a frequency of a clock signal underlying data input signal di (also referred to simply as frequency of data input signal di), for example, two times higher, three times higher, four times higher or more. A factor by which a clock frequency of oscillator 13 is higher than the frequency of di will be referred to as N in the following.

An output signal of counter 14 is fed to a phase detector 11 via a modulo operator 15, which performs a modulo N operation on the output signal of counter 14. In some embodiments, as will be explained later the modulo operation yields a result of zero if the output signal of oscillator 13 is aligned with data input signal di and yields a non-zero result otherwise. Phase detector 11 may be implemented as an adder in the digital domain, as will be explained later. An output signal of phase detector 11 is fed to a loop filter 12, the output signal of which controls digitally controlled oscillator 13. With the arrangement shown in FIG. 1, in embodiments an output signal of oscillator 13 may be aligned with data input signal di and then be used to sample data input signal di to recover data transmitted therewith.

Next, with respect to FIG. 2 a digital phase detector device according to an embodiment will be discussed. The phase detector device of FIG. 2 may, for example, be used in the embodiment of FIG. 1 as an implementation of phase detector 11 together with modulo operation 15, but may also be used in other applications than the one shown in FIG. 1.

Figure 2:
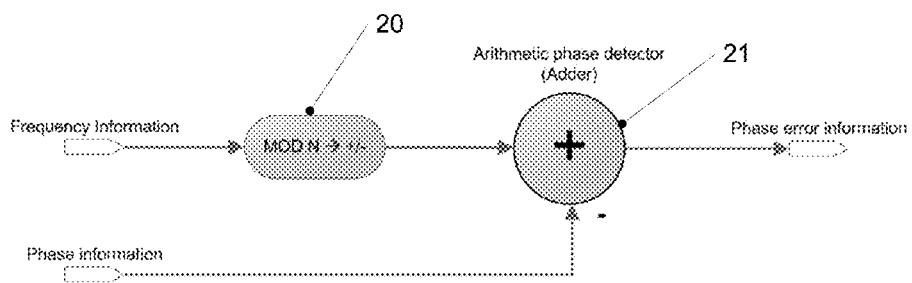
FIG. 2 is a diagram illustrating a digital phase detector in a mode of operation, according to an embodiment.

The phase detector device of FIG. 2 comprises an adder 21. At a negative input, adder 21 receives a phase information, which may, for example, be obtained by sampling different output signals of an oscillator having a same frequency, but different phases. Furthermore, at a positive input adder 21 receives a frequency information via a modulo operation 20, which may be similar to the modulo operation 15 of FIG. 1. "Positive" and "negative" with respect to the input refers to the signs with which the signals are added in adder 21. For example, in the embodiment shown, adder 21 effectively acts as a subtractor. In other embodiments, the signs may differ, e.g., depending on how the respective signals are formed. Frequency information may be obtained, for example, by counting a number of cycles or periods of an oscillator signal between edges of a data input signal. Adder 21 then outputs the result of the addition (or subtraction) as phase error information.

In some embodiments, the configuration shown in FIG. 2 corresponds to a first mode of operation of the phase detector device, and a second mode of operation will be described below referring to FIG. 3. In other embodiments, a phase detector device may have only a single mode of operation, for example, the mode of operation shown in FIG. 2. The mode of operation illustrated with respect to FIG. 2 may, for example, be used for clock recovery in clock and data recovery (CDR) circuits.

Figure 3:
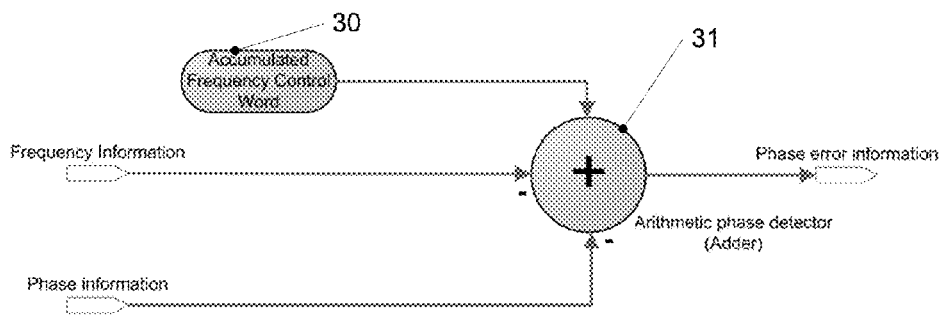
FIG. 3 is a schematic diagram illustrating a digital phase detector according to an embodiment, in another mode of operation.

In the second mode of operation illustrated in FIG. 3, also an adder 31 is provided, which in some embodiments may correspond to adder 21 of FIG. 2. Adder 31 receives frequency information and phase information at two negative inputs of adder 31. Phase information may, for example, be obtained by sampling a plurality of output signals of an oscillator having the same frequency, but different phases. Furthermore, the frequency information in case of the mode of operation of FIG. 3 may, for example, be obtained by supplying a reference frequency to a counter and counting a number of cycles of an output signal of the oscillator between edges of the reference frequency, for example, between rising edges, between falling edges or both. As can be seen, compared to the mode of operation of FIG. 2 no modulo operation like modulo operation 20 of FIG. 2 is present. In some embodiments, for switching between modes of operation, for example, modulo operator 20 may be bypassed to switch to the mode of operation of FIG. 3 or may be deselected using a multiplexer.

Furthermore, in the embodiment of FIG. 3, at a positive input adder 31 receives an accumulated frequency control word 30. Via this accumulated frequency control word, when the phase detector of FIG. 3 is used, e.g., in a phase locked loop a relationship between an output frequency of a controllable oscillator and a reference frequency may be adjusted. In some embodiments, for example, to switch from the mode of operation of FIG. 3 to the mode of operation of FIG. 2, the accumulated frequency control word 30 may be set to zero.

In some embodiments, as already mentioned a phase detector having a mode of operation as shown in FIG. 2 may be realized to implement a clock recovery circuit. Furthermore, in some embodiments, a phase detector having two modes of operation as shown in FIGS. 2 and 3 may be used to implement a device which is switchable between a clock recovery mode and a conventional phase locked loop (PLL) mode.

Figure 4:
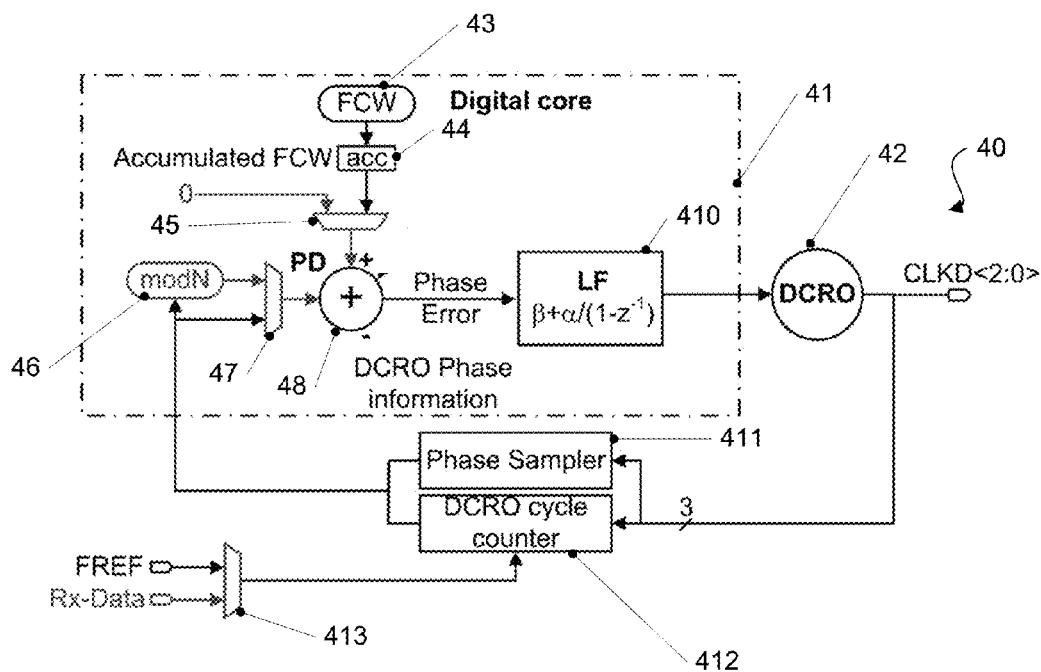
FIG. 4 is a block diagram illustrating a clock recovery/phase locked loop device according to an embodiment.

FIG. 4 illustrates a device 40 according to such an embodiment.

Device 40 of FIG. 4 comprises a digital core 41 which, as will be explained in the following in more detail, controls a digitally controlled oscillator (DCO) 42, for example, a digitally controlled ring oscillator (DCRO). In other embodiments, other kinds of controllable oscillators may be used. In an example, digitally controlled oscillator 42 may output three output signals CLKD having the same frequency, but different phases. They may be represented as a three bit signal <2:0>. In other embodiments, a different number of signals may be output by digitally controlled oscillator 42, for example, two signals or four signals. In some embodiments, the phases of the signals may be equally spaced. For example, in case of three signals the phase difference between successive signals may be 120 degrees.

The output signals of digitally controlled oscillator 42, three signals in the example of FIG. 4, are fed to a phase sampler 411. Furthermore, one of the output signals is fed to a cycle counter 412. Phase sampler 411 samples the three clock signals, e.g., counts the edges of the clock signals, based on a signal supplied via a multiplexer 413. Furthermore, cycle counter 412 counts a number of cycles of an output signal of digitally controlled oscillator 42 between two edges, for example, between two rising edges or between two falling edges, of the signal supplied by multiplexer 413. Phase sampler 411 therefore obtains a fractional phase difference (phase difference between the output of digitally controlled oscillator 42 and the signal supplied by multiplexer 413), which in embodiments corresponds to a "phase information" signal of FIG. 2 or FIG. 3. Moreover, cycle counter 412 obtains an integer phase information or frequency information, which in embodiments corresponds to the "frequency information" of FIG. 2 or 3.

As illustrated in FIG. 4, in a first mode of operation which is a clock recovery mode multiplexer 413 forwards a received data signal Rx-data to phase sampler 411 and cycle counter 412. In a second mode of operation, where device 40 acts as a conventional phase locked loop (PLL), a reference signal FREF having a reference frequency is provided to cycle counter 412 and phase sampler 411 by multiplexer 413. Reference signal FREF in some embodiments may also be used as a clock signal for digital core 41.

Output signals of phase sampler 411 and cycle counter 412 are fed to a phase detector device implemented in digital core 41. In the first mode of operation, for example, the phase detector may operate as shown in FIG. 3, and an output of cycle counter 412 may correspond to the frequency information of FIG. 3, and an output of phase sampler 411 may correspond to the phase information of FIG. 3. For example, phase detector device may comprise an adder 48. In the second mode of operation, the output of cycle counter 412 is fed as a phase information to adder 48 via a modulo N operation 46. A modulo operation generally outputs the rest of a division by N. N in the embodiment of FIG. 4 may be a ratio of a frequency of the output signal of digitally controlled oscillator 42 to a frequency underlying the data signal Rx-data. In embodiments, N may, for example, be two, three, four or higher. In some embodiments, even numbers N are used, as in some embodiments with even numbers a modulo operation may be easier to implement, although odd numbers may be used as well. In other words, cycle counter 412 outputs a ratio of the frequency of the output signal of digitally controlled oscillator 42 to a frequency of a signal supplied by multiplexer 413.

Furthermore, a frequency control word 43 may be accumulated in digital core by a accumulator 444 with each clock cycle of FREF in an embodiment and supplied to adder 48 via a multiplexer 45 in the first mode of operation. In the second mode of operation, multiplexer 45 simply may supply a zero.

A phase error output by adder 48 is fed to a loop filter 410. Loop filter 410 may have an integral gain and a proportional gain, as expressed by the z-transform $\beta + a/(1-z^{-1})$ in FIGS. 4, $\alpha$ and $\beta$ being parameters.

An output of loop filter 410 controls digitally controlled oscillator 42.

The components of digital core 41 may, for example, be implemented by a digital signal processor or other processing device programmed accordingly, or in hardware, for example, by a corresponding digital circuit.

With device 40 of FIG. 4, in the first mode of operation, for example, a clock recovery may be performed to recover a clock signal underlying data signal Rx-data. Examples for such a recovery which may apply to an implementation of device 40 will be discussed further below in detail for illustration purposes.

In the second mode of operation, the device 40 of FIG. 4 essentially acts as a conventional all digital phase locked loop (ADPLL). In other embodiments, some of the components shown in FIG. 4 may comprise analog elements.

In some embodiments, the device 40 may be operated in the first mode of operation, for example, at a slave side of a communication signal, where no data clock signal is provided, while the second mode of operation (PLL) may be used as a master side to generate a data clock.

Figure 5:
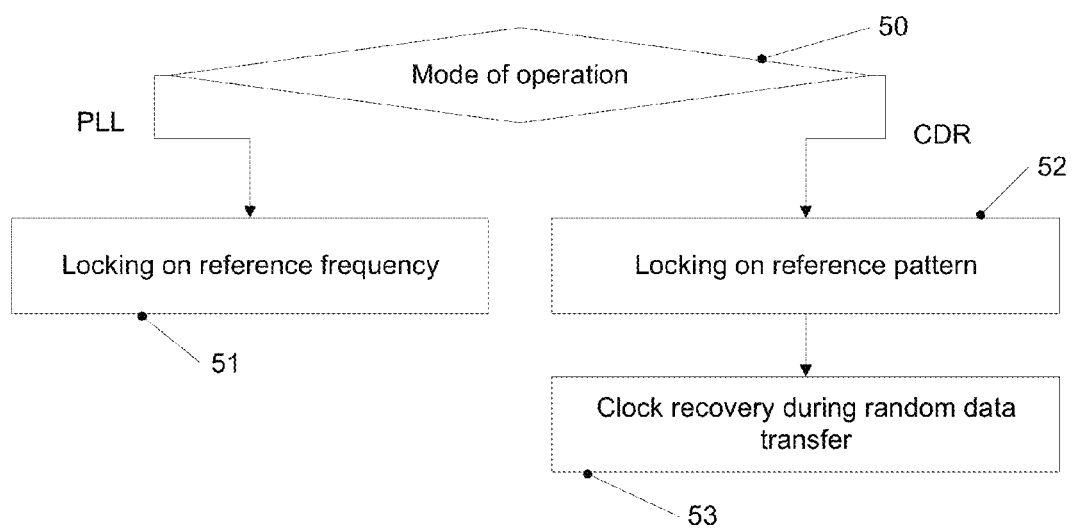
FIG. 5 is a flowchart illustrating a method according to an embodiment.

In FIG. 5, a flowchart illustrating a method according to an embodiment is shown. The method illustrated with respect to FIG. 5 may, for example, be implemented using device 40 of FIG. 4 and/or using the phase detector discussed with reference to FIG. 2 or 3, may be implemented using concepts illustrated with respect to FIG. 1, but may also be implemented using other devices. For further illustration, reference will also be made to FIGS. 6 and 7, which show non-limiting examples for signals for further illustration. It is to be emphasized that in other embodiments the signals may differ.

Referring now to FIG. 5, at 50 a mode of operation is selected. The mode of operation may be a conventional phase locked loop (PLL) mode, which may correspond to the second mode of operation of device 40 of FIG. 4. The mode may also be a clock recovery mode used for clock and data recovery (CDR), which may correspond to the first mode of operation of device 40 of FIG. 4. In case the PLL mode is selected, at 51, an output frequency of an oscillator is locked on a reference frequency, for example, a frequency of FREF in FIG. 4. For example, when the method of FIG. 5 is performed using the device of FIG. 4, the device of FIG. 4 is operated in the above-discussed second mode of operation. In case the mode of operation is a clock recovery mode to perform a clock and data recovery, the method of FIG. 5 at 52 comprises locking on a reference pattern. For example, a data transmitter may send a periodic predetermined data pattern, for example, may send a predefined data frame repetitively. In case the embodiment of FIG. 4 is used as a device for implementing the method, in this case the received data Rx-data may be provided by multiplexer 413 to cycle counter 412, but modulo operator 46 may be deactivated. Furthermore, an appropriate frequency control word 43 may be selected. This will be further illustrated using example signals with reference to FIG. 6. It should be noted that the example signals of FIG. 6 serve only for illustrating the locking on a reference pattern at 52 further, but are not to be construed as limiting. In particular, in other embodiments other patterns, or other signal frequencies, than discussed below may be used.

Figure 6:
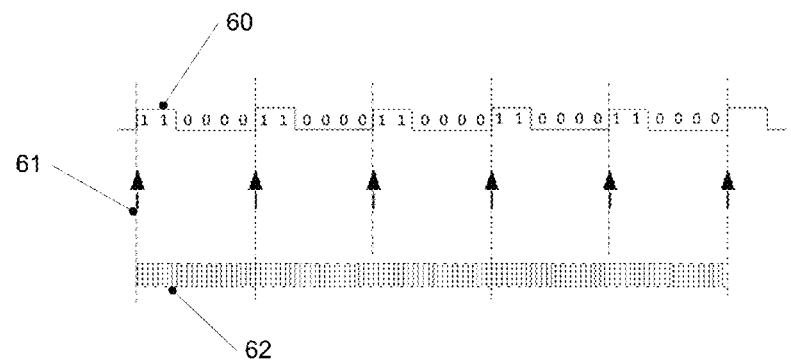
FIGS. 6 and 7 are example signal diagrams illustrating operation of some embodiments.

In FIG. 6, 60 designates an example reference pattern which may be sent during 52 of FIG. 5. In the example of FIG. 6, the reference pattern has a length of six bits, with two "1"s followed by four "0"s. Therefore, pattern 60 in the example shown has a periodicity of F=6 bits. Other patterns with known frequency information, i.e., known periodicity, may be employed. Any protocol which offers such a periodic pattern during an initialization phase of a communication link may be used. Furthermore, at 62, a clock of an oscillator like oscillator 42 of FIG. 4 or oscillator 13 of FIG. 1 is illustrated. Oscillator signal 62 in the example of FIG. 6 has an oversampling ratio of N=2, i.e., the frequency of signal 62 corresponds to twice the frequency of the data corresponding to pattern 60 (i.e., two periods of signal 62 during one bit of data of pattern 60). In this case, a frequency control word, also referred to as frequency multiplication factor, of a phase locked loop operated in clock recovery mode FCW is equal to N·F. In the example, FCW would be 2·6=12. With such an adjustment, the oscillator locks on the reference pattern 60 as indicated by arrows 61, i.e., each 12th rising edge of signal 62 is aligned to the start of the pattern (the first "1"), for example, using device 40 of FIG. 4.

Therefore, essentially at 52 a clock recovery device like the one shown in FIG. 4 operates in a "normal" PLL mode with the exception that a predefined data pattern is supplied as a reference signal.

After locking on the reference pattern, the method of FIG. 5 at 53 performs clock recovery during random data transfer. In other words, at 53 data is received which does not have an predefined pattern (for example, payload data), and based on the received data a clock signal is generated or adjusted, which may then be used to sample the data. For example, when using device 40 of FIG. 4, the device is used in the first mode of operation including the "modulo N" operation 46.

Figure 7:
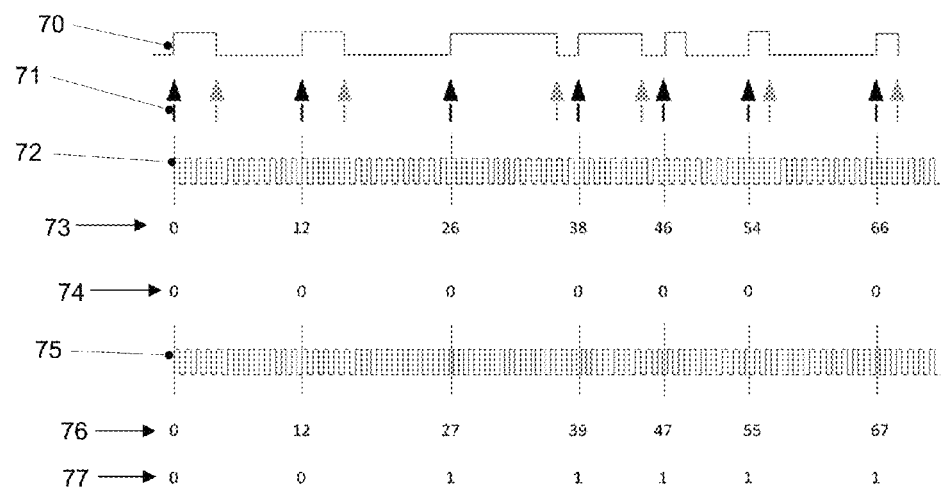

The clock recovery during random data transfer will be further explained using example signals with reference to FIG. 7. Again, the signals shown in FIG. 7 serve merely for illustration purposes to provide a better understanding and are not to be construed as limiting. For example, in other embodiments, other signal waveforms and/or other frequencies may be used. At 70, FIG. 7 shows an example for a random data pattern which may be received, for example, by device 40 of FIG. 4. 72 shows an oscillator in an ideal locked state, where rising edges and falling edges of the data correspond to edges of oscillator signal 72, as indicated by arrows 71. In the example of FIG. 7, similar to the example of FIG. 6 N=2, i.e., a frequency fDCRO of an oscillator like, for example, oscillator 42 of FIG. 4 is twice a data frequency. In other embodiments, other values of N may be used, for example, N=3, N=4 or more.

The data signal 70 is, for example, supplied to a cycle counter like cycle counter 412 of FIG. 4. The results of the count for the locked case of signal 72 are shown in a row 73 of FIG. 7. In this example, counting is performed between rising edges of data signal 70.

In embodiments, as explained previously, a modulo N operation is performed on the cycle count of line 73, the result of which is shown in a line 74. In the ideal locked case, as shown in FIG. 7, the result of the modulo operation (modulo 2 in this case) is zero for all cases, which indicate that the oscillator is aligned with the rising edges of the data. Generally, the differences between two data edges in this case is equal N·fDCRO, meaning that in a locked state a modulo N operation a zero results in an aligned or locked case.

Furthermore, FIG. 7 shows a clock signal 75 which is not always perfectly aligned to the data signal 70. Such a misalignment may, for example, be caused by jitter introduced to the system like data jitter or oscillator jitter. In a row 76, similar to row 73 the result of a cycle counter is shown and a row 77 illustrates the results of a modulo N (in the example modulo 2) operation. As illustrated in FIG. 7, when oscillator signal 75 leaves the alignment, the count in row 76 may result in odd numbers, which leads to a non-zero result of the modulo operation as shown in a row 77. This information indicates a deviation and, as discussed with reference to FIG. 4, may then be used to control an oscillator like oscillator 42 to restore the alignment, possibly together with fractional phase information provided by a phase sampler like phase sampler 411 of FIG. 4.

Therefore, as illustrated above in detail, in embodiments an all digital clock recovery circuit is provided. Moreover, as explained in some embodiments, the circuit may be switched between a clock and data recovery mode of operation and a PLL mode of operation. In other embodiments, only a clock and data recovery mode of operation may be provided.

The above-mentioned embodiments serve only as illustrative examples, and the techniques and concepts disclosed herein may also be implemented in different manners than explicitly shown or described.

What is claimed is:

1. A device comprising a phase detector, the phase detector comprising:
    a frequency information input;
    a phase information input;
    an adder, the frequency information input being coupled with a first input of the adder and the phase information input being coupled with a second input of the adder; and
    a modulo operation coupled between the frequency information input and the first input of the adder, wherein the modulo operation is an operation which outputs a rest of a division by N.

2. The device of claim 1, wherein the modulo operation is operative in a first mode of operation of the phase detector and non-operative in a second mode of operation of the phase detector, the device further comprising a frequency control word accumulator, an output of the frequency control word accumulator being coupled with a third input of the adder, the frequency control word accumulator being operative in the second mode of operation and non-operative in the first mode of operation.

3. The device of claim 2, wherein an output of the modulo operator is coupled with a first input of a multiplexer, an output of the multiplexer being coupled with the first input of the adder, the multiplexer further having a second input, and wherein the multiplexer is adapted to select the first input in the first mode of operation and the second input in the second mode of operation.

4. The device of claim 1, wherein the first input of the adder is a positive input of the adder and the second input of the adder is a negative input of the adder.

5. The device of claim 1, further comprising a controllable oscillator coupled to an output of the adder, and a loop filter coupled between the output of the adder and the controllable oscillator.

6. The device of claim 5, further comprising a cycle counter, a first input of the cycle counter being coupled to an output of the oscillator, a second output of the cycle counter being coupled to a data input, and an output of the cycle counter being coupled to the modulo operation, the cycle counter being adapted to count a number of cycles of an output signal of the oscillator between edges of a signal at a data input.

7. The device of claim 6, further comprising a further multiplexer, a first input of the further multiplexer being coupled to the data input, a second input of the further multiplexer being coupled to a reference frequency input, and an output of the further multiplexer being coupled to the second input of the cycle counter.

8. The device of claim 6, further comprising a phase sampler, the phase sampler being adapted to receive a plurality of output signals of the oscillator, an output of the phase sampler being coupled to the phase input of the phase detector.

9. The device of claim 1, wherein the device is switchable between a phase locked loop (PLL) mode of operation and a clock recovery mode of operation.

10. The device of claim 1, wherein the phase detector is part of a phase locked loop, wherein, for clock recovery, the device is adapted to:
    in an initialization phase, lock the phase locked loop to a periodic data pattern, and
    after the initialization phase, adapt the locking of the phase locked loop to random data.

11. A device, comprising:
    an oscillator;
    a counter, a first input of the counter being coupled to an output of the oscillator and a second input of the counter being coupled to a data input;
    a modulo operator being coupled to an output of the counter;
    a phase detector being coupled to an output of the modulo operator; and
    a loop filter being coupled to an output of the phase detector, wherein an output of the loop filter is coupled with a control input of the oscillator.

12. The device of claim 11, wherein a frequency of the oscillator is N times a frequency of a data clock underlying a data signal at the data input, and
    wherein the modulo operator is a modulo N operator.

13. The device of claim 11, wherein the device is an all digital device.

14. A method, comprising:
    locking an oscillator on a reference pattern; and
    performing clock recovery during a random data transfer after the locking, wherein performing the clock recovery comprises performing a modulo operation on a number of cycles of an oscillator output signal between edges of the random data.

15. The method of claim 14, wherein performing the clock recovery further comprises controlling an oscillator based on an output of the modulo operation.

16. The method of claim 14, wherein a frequency of the oscillator output signal is N times a frequency of the random data, wherein the modulo operation is a modulo N operation.

17. The method of claim 16, wherein N is an even number.

18. The method of claim 16, wherein N is at least 4.

19. The method of claim 14, further comprising selecting a mode of operation, wherein the locking and the performing is performed in a first mode of operation, and wherein in a second mode of operation a locking on a reference frequency is performed.

20. The method of claim 19, further comprising selecting the first mode of operation when the method is performed in a slave device, and selecting the second mode of operation when the method is performed in a master device.

* * * * *